United States Patent
Lee

(10) Patent No.: US 6,525,800 B2
(45) Date of Patent: Feb. 25, 2003

(54) LIQUID CRYSTAL DISPLAY (LCD) CELL TRANSPORT APPARATUS

(75) Inventor: Shih Yang Lee, Kaohsiung (TW)

(73) Assignee: Hannstar Display Corp. (TW)

( * ) Notice: Subject to any disclaimer, the term of this patent is extended or adjusted under 35 U.S.C. 154(b) by 0 days.

(21) Appl. No.: 09/953,564

(22) Filed: Sep. 17, 2001

(65) Prior Publication Data

US 2002/0154267 A1 Oct. 24, 2002

(30) Foreign Application Priority Data

Apr. 19, 2001 (TW) ........................................ 90109685 A

(51) Int. Cl.⁷ ........................ G02F 1/1333; B65G 47/00
(52) U.S. Cl. ........................ 349/187; 414/940; 414/941
(58) Field of Search .................. 349/187; 414/940, 414/941; 700/121, 56–63, 108–110, 112–117, 245, 255

(56) References Cited

U.S. PATENT DOCUMENTS

| | | | |
|---|---|---|---|
| 5,643,368 A | | 7/1997 | Nakashima |
| 5,664,927 A | * | 9/1997 | Takeuchi .................... 414/225 |
| 6,396,072 B1 | * | 5/2002 | Meyhofer et al. ....... 250/559.4 |
| 6,443,686 B1 | * | 9/2002 | Wiesler et al. .............. 414/590 |

* cited by examiner

Primary Examiner—Toan Ton
Assistant Examiner—Hoan Nguyen

(57) ABSTRACT

A LCD cell transport apparatus comprises a transfer robot arm having a base for supporting and transferring a carrier (such as a cleaning basket) loaded with LCD cells in a cleaning system. The LCD cell transport apparatus is characterized in that the three corners of the base are respectively provided with spacers, wherein each spacer has a thickness different from one another.

6 Claims, 4 Drawing Sheets ated to the substrates to maintain a precise cell gap (between 5–10 micrometers) between the two substrates. The substrates are then aligned and laminated by heat and pressure to complete the cross-linking of the polymer.

LIQUID CRYSTAL DISPLAY (LCD) CELL TRANSPORT APPARATUS

BACKGROUND OF THE INVENTION

1. Field of the Invention

The present invention generally relates to fabrication of liquid crystal display (LCD), and more particularly to a transport apparatus used in a cleaning process of LCD cells.

2. Description of the Related Art

In the LCD manufacturing process, two glass substrates are joined with seal material, and liquid crystal (LC) material is injected into the small space therebetween. Next, polarizing films are attached onto the outside of each substrate and the driver electronic PWBs are attached thereon. Finally, a backlight unit is added to complete the LCD module.

Specifically, the glass substrates are assembled by the following steps. First, an adhesive seal material is applied, usually by either silkscreening or screen printing. An opening is left in the seal for LC material injection in the subsequent process. After the adhesive is applied, it is cured in order to outgas solvents in the material and achieve partial cross-linking of the polymer. This makes the material less tacky (B-stage material), which allows the substrates to contact with each other during alignment. Before assembling the two substrates, spacers are deposited on one of the substrates to maintain a precise cell gap (between 5–10 micrometers) between the two substrates. The substrates are then aligned and laminated by heat and pressure to complete the cross-linking of the polymer.

After the assembling process is completed, the assembled glass substrates are cut into individual LCD cells. The LC material is injected into the gap produced by the spacer. The opening that was left open for this injection is sealed with the same type of resin and cured. Finally, polarizers, typically in precut sheets, are attached onto the outside of each LCD cell through an adhesive layer that is already on one side of the polarizers.

A cleaning process for cleaning the LCD cells is essential in the fabrication of LCD devices, e.g., after injection of LC material or before the attachment of polarizers. Such a cleaning process generally includes a chemical treatment process in which the LCD cells are immersed in a chemical liquid for surface treatment and a rinse process in which the LCD cells are immersed in tap water and pure water for removing the residual chemical liquid from the surface of the LCD cells.

FIG. 1 shows a conventional LCD cell transport apparatus 100 for transporting a cleaning basket 110 loaded with LCD cells 120 from one cleaning sink 130 to another in a cleaning system. The LCD cell transport apparatus 100 includes a transfer robot arm 102 having a base 102a. The base 102a is usually configured to have a flat surface for supporting the cleaning basket 110. Therefore, when the transfer robot arm 102 takes out the cleaning basket 110 from the cleaning sink 130, liquids (such as chemical liquid, tap water and pure water) tend to remain in the notch 120a of LCD cells 120 thereby adversely affecting the drying quality. Further, it is easy to find impurities remained in the seam of the glass substrates of the LCD cells 120 after drying. These impurities have adverse effect on the quality of the cleaning process.

In manufacturing LCD device, the yield and the quality of the products are remarkably lower if contaminants such as impurities adhere to the LCD cells 120. Accordingly, there exist the needs for improving the cleaning quality for the LCD cells.

SUMMARY OF THE INVENTION

It is a primary objective of the present invention to provide a liquid crystal display (LCD) cell transport apparatus capable of greatly enhancing the quality of the cleaning process.

In accordance with the above object, we discloses a LCD cell transport apparatus comprising a transfer robot arm having a base for supporting and transferring a cleaning basket loaded with LCD cells. The LCD cell transport apparatus is characterized in that the three corners of the base are respectively provided with spacers, wherein each of the spacers has a thickness different from one another. When the cleaning basket with LCD cells disposed therein is placed on the base, the cleaning basket has a corner at a level lower than the other corners. Therefore, when the transfer robot arm takes out the cleaning basket with LCD cells from liquid in the cleaning sink, the residual liquid on the surface of the LCD cells will gather up and flow to the corner at the lowest level, thereby minimizing the retention of liquid upon the LCD cell.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
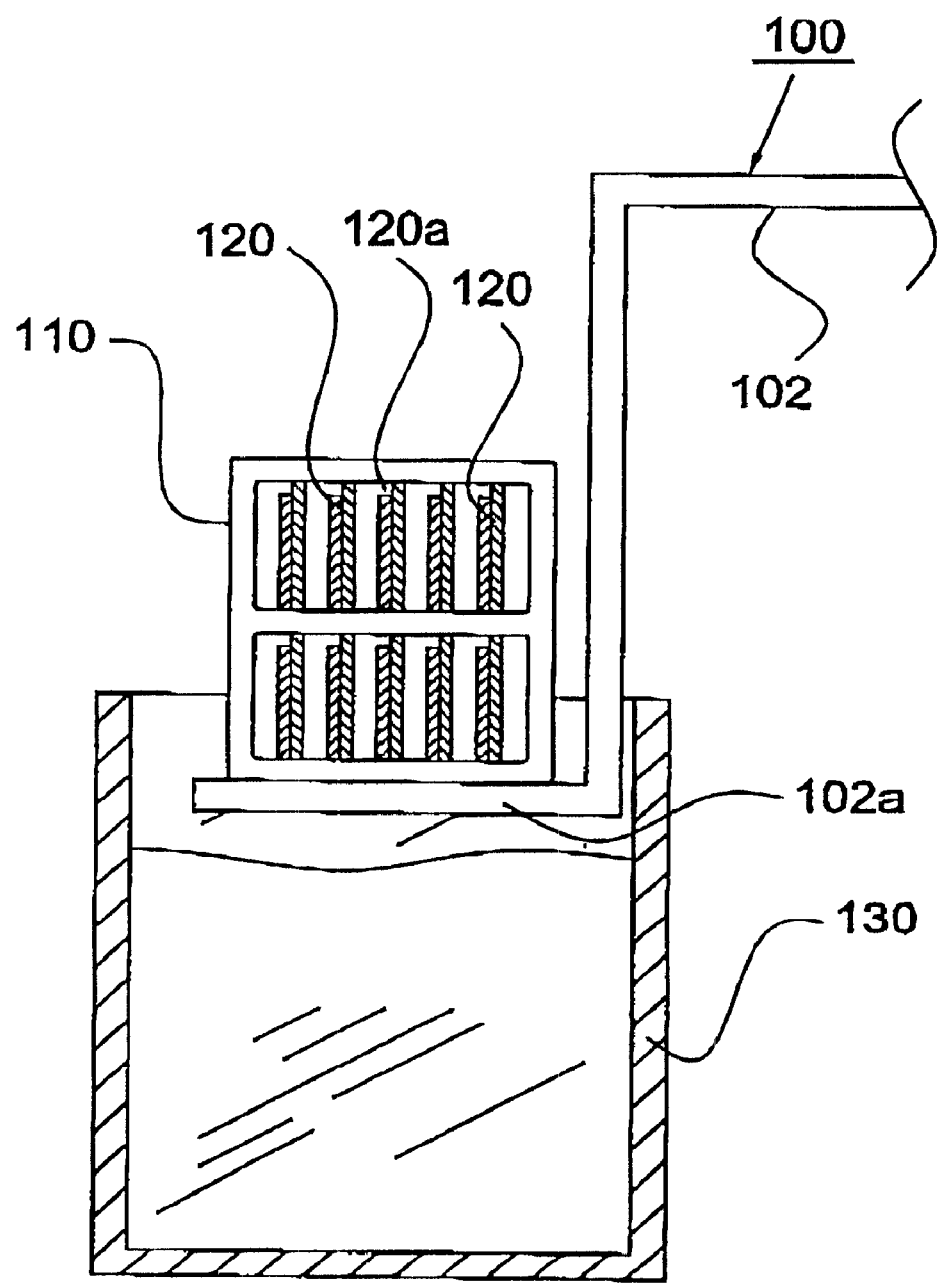
FIG. 1 illustrates a conventional LCD cell transport apparatus utilized in cleaning process.
Figure 2:
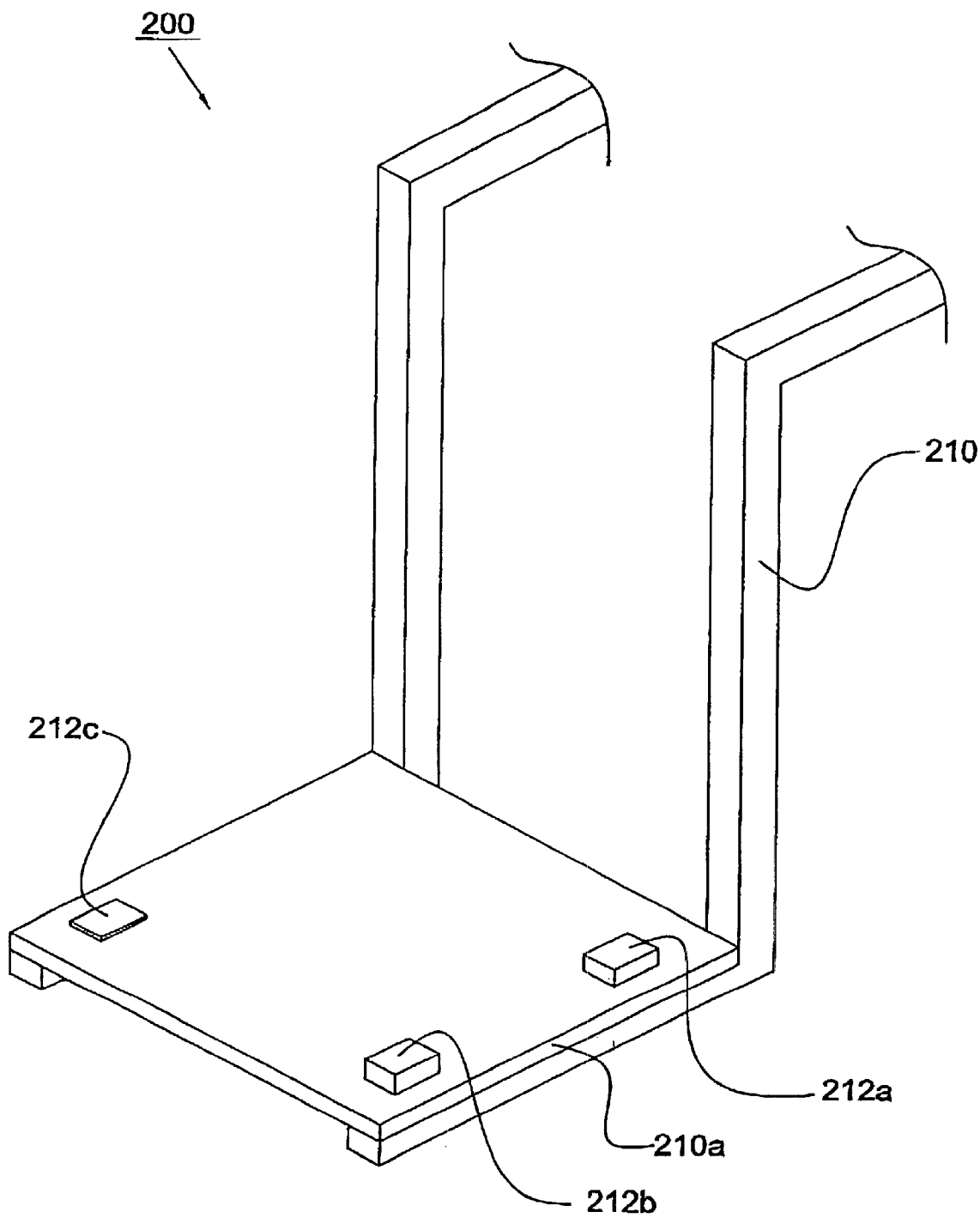
FIG. 2 is a perspective view of a LCD cell transport apparatus according to a preferred embodiment of the present invention.

FIG. 2 shows a LCD cell transport apparatus 200 according to a preferred embodiment of the present invention. The apparatus 200 comprises a transfer robot arm 210 having a base 210a for supporting and transferring a carrier loaded with LCD cells. The transport apparatus 200 has four corners and three corners thereof are respectively provided with spacers, ie., 212a, 212b, 212c wherein each of the spacers has a thickness different from one another. The transfer robot arm 210 is movable so that the base 210a can be placed inside a cleaning sink, and then can be took out from the cleaning sink, and transferred to another cleaning sink in a cleaning system.

Figure 3:
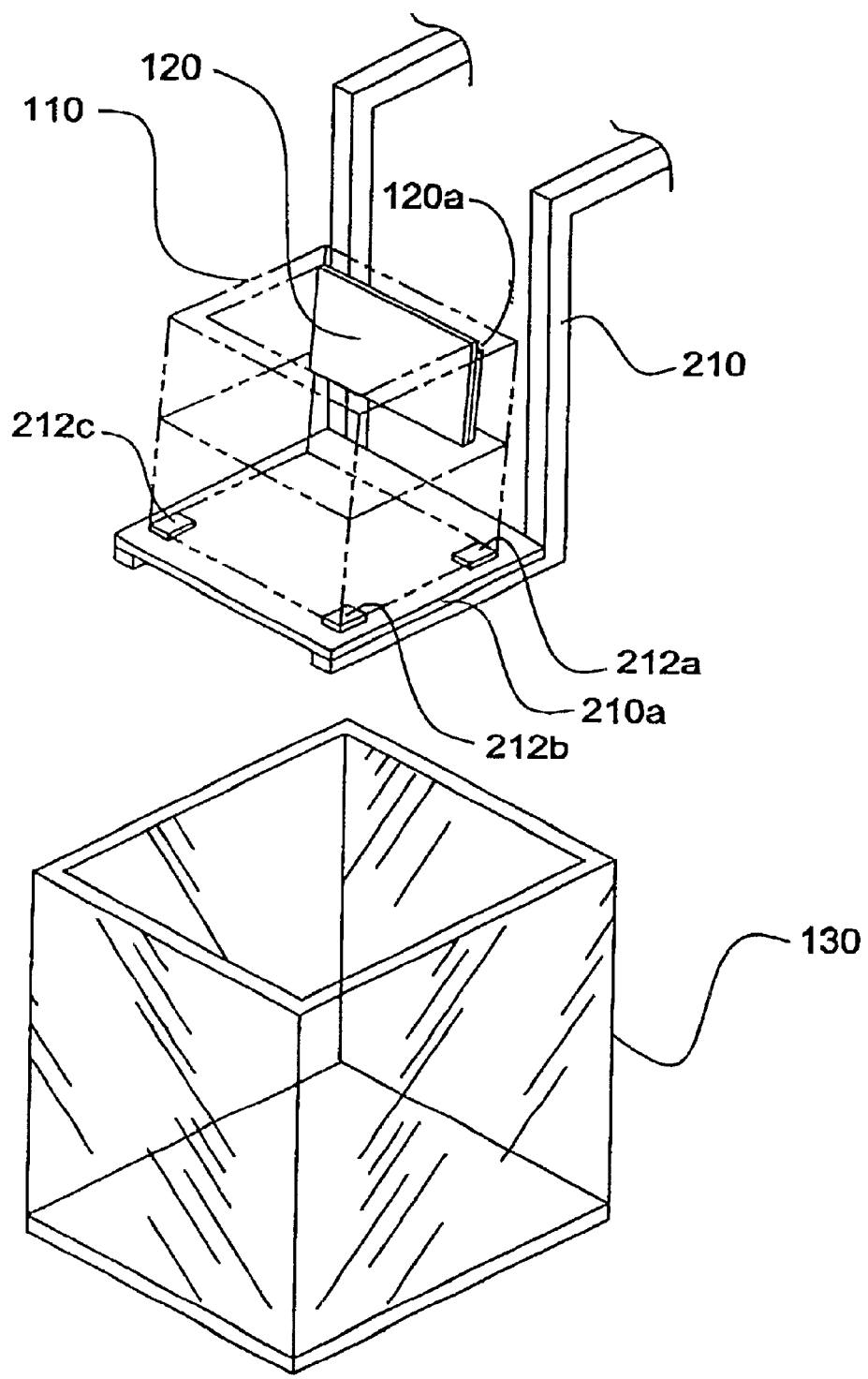
FIGS. 3–4 illustrate the LCD cell transport apparatus of FIG. 2 utilized in cleaning process.

FIG. 3 shows a carrier such as a cleaning basket 110 with LCD cells 120 disposed therein is placed on the spacers 212a, 212b, 212c and the base 210a of the LCD cell transport apparatus 200 described above. Since each of the spacers 212a, 212b, 212c has a thickness different from one another, the cleaning basket 110 has a corner at a level lower than the other three corners. Preferably, the lowest one of the spacers has a thickness of about 0.5 mm, the highest one of the spacers has a thickness of about 15 mm and the medium one of the spacers has a thickness of about 10 mm.

Figure 4:
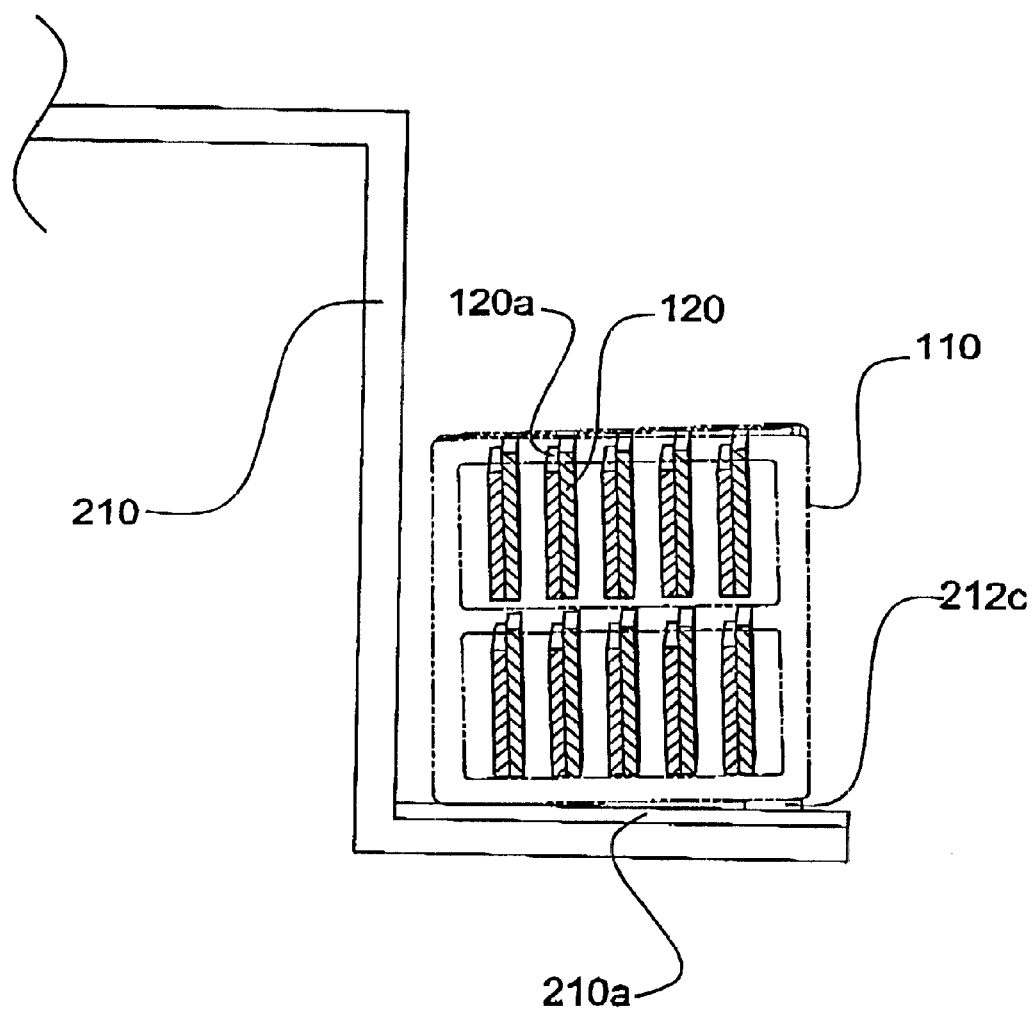

Referring to FIG. 4, when the transfer robot arm 210 takes out the cleaning basket 110 with LCD cells from a cleaning sink in a cleaning system, the residual liquid in the notches 120a of the LCD cells will gather up and flow to the lowest corner of the cleaning basket 110, thereby minimizing the retention of liquid upon the LCD cell. In this way, not only the deposition of impurities on the processed LCD cells is minimized, but also the contamination of another cleaning sink by the liquid carried along with the processed LCD cells is greatly reduced.

It could be understood that the spacers 212a, 212b, 212c in the LCD cell transport apparatus 200 described above may be replaced by three protrusions integrally formed with the base. When a cleaning basket with LCD cells is placed on the protrusions and the base, since each of the protrusions has a protruding height different from one another, the cleaning basket has a corner at a level lower than the other corners, thereby minimizing the retention of liquid upon the LCD cell. Preferably, the lowest one of the protrusions has a protruding height of about 0.5 mm, the highest one of the protrusions has a protruding height of about 15 mm and the medium one of the protrusions has a protruding height of about 10 mm.

Although the invention has been explained in relation to its preferred embodiment, it is to be understood that many other possible modifications and variations can be made without departing from the spirit and scope of the invention as hereinafter claimed.

What is claimed is:

1. A liquid crystal display (LCD) cell transport apparatus for transporting a carrier loaded with LCD cells from one cleaning sink to another, the LCD cell transport apparatus comprising a transfer robot arm having a base for supporting and transferring the carrier with LCD cells loaded therein, the base having four corners and three corners thereof being respectively provided with a spacer, each of the spacers having a thickness different from one another.

2. The LCD cell transport apparatus as claimed in claim 1, wherein the lowest one of the spacers has a thickness of about 0.5 mm.

3. The LCD cell transport apparatus as claimed in claim 2, wherein the highest one of the spacers has a thickness of about 15 mm and the medium one of the spacers has a thickness of about 10 mm.

4. A liquid crystal display (LCD) cell transport apparatus for transporting a carrier loaded with LCD cells from one cleaning sink to another in a cleaning system, the LCD cell transport apparatus comprising a transfer robot arm having a base for supporting and transferring the carrier with LCD cells loaded therein, the base having four protrusions and three protrusions thereof respectively having a protruding height different from one another.

5. The LCD cell transport apparatus as claimed in claim 4, wherein the lowest one of the protrusions has a protruding height of about 0.5 mm.

6. The LCD cell transport apparatus as claimed in claim 4, wherein the highest one of the protrusions has a protruding height of about 15 mm and the medium one of the protrusions has a protruding height of about 10 mm.

* * * * *